United States Patent
Karkkainen et al.

(10) Patent No.: US 10,250,683 B2
(45) Date of Patent: Apr. 2, 2019

(54) SERVER NODE ARRANGEMENT AND METHOD

(71) Applicant: GURULOGIC MICROSYSTEMS OY, Turku (FI)

(72) Inventors: Tuomas Mikael Karkkainen, Turku (FI); Ossi Mikael Kalevo, Akaa (FI); Valtteri Hakkarainen, Turku (FI)

(73) Assignee: GURULOGIC MICROSYSTEMS OY, Turku (FI)

( * ) Notice: Subject to any disclaimer, the term of this patent is extended or adjusted under 35 U.S.C. 154(b) by 465 days.

(21) Appl. No.: 14/885,543

(22) Filed: Oct. 16, 2015

(65) Prior Publication Data

US 2016/0036915 A1 Feb. 4, 2016

Related U.S. Application Data

(63) Continuation of application No. PCT/EP2014/001051, filed on Apr. 21, 2014.

(30) Foreign Application Priority Data

Apr. 23, 2013 (GB) .................................. 1307342.4

(51) Int. Cl.
*G06F 15/16* (2006.01)
*H04L 29/08* (2006.01)
(Continued)

(52) U.S. Cl.
CPC .... *H04L 67/1097* (2013.01); *G08B 13/19665* (2013.01); *H04N 21/21805* (2013.01);
(Continued)

(58) Field of Classification Search
USPC ...... 348/14.01, 170, 571; 714/752; 709/203, 709/206, 217, 219, 223, 224, 226, 228,
(Continued)

(56) References Cited

U.S. PATENT DOCUMENTS

| | | | |
|---|---|---|---|
| 2001/0047517 A1 | 11/2001 | Christopoulos et al. | |
| 2004/0218099 A1* | 11/2004 | Washington | H04N 5/77 348/571 |

(Continued)

FOREIGN PATENT DOCUMENTS

| | | |
|---|---|---|
| EP | 1463332 A1 | 9/2004 |
| EP | 1725037 A2 | 11/2006 |

(Continued)

OTHER PUBLICATIONS

Office Action issued by the Patent Office of the Russian Federation (ROSPATENT) Federal Institute of Industrial Property in relation to Russian Application No. 2015143011/07(066389) dated Jul. 25, 2017 (7 pages) along with English language translation (3 pages).

(Continued)

*Primary Examiner* — Quang N Nguyen
(74) *Attorney, Agent, or Firm* — Robert P. Michal, Esq.; Carter, DeLuca & Farrell LLP (57) ABSTRACT

A server node arrangement includes a plurality of server nodes. The server node arrangement is coupled via communication network to a plurality of sources of input data, and to one or more output devices. The server node arrangement receives data content from the plurality of sources of input data, and processes the data content to supply to at least a subset of the output devices. The server node arrangement hosts one or more processes which process the data content into a form which is compatible to a native data rendering format of the subset of the output devices. The at least a subset of the output devices are operable to render the data content simultaneously. The server node arrangement provides a system which communicates content data in a more computationally efficient manner, which is capable of saving energy utilization.

25 Claims, 4 Drawing Sheets

(51) Int. Cl.
*G08B 13/196* (2006.01)
*H04N 21/4788* (2011.01)
*H04N 21/218* (2011.01)
*H04N 21/2343* (2011.01)
*H04N 21/2365* (2011.01)

(52) U.S. Cl.
CPC . *H04N 21/2365* (2013.01); *H04N 21/234309* (2013.01); *H04N 21/4788* (2013.01)

(58) Field of Classification Search
USPC .......................................... 709/230, 232, 238
See application file for complete search history.

(56) References Cited

U.S. PATENT DOCUMENTS

| | | | |
|---|---|---|---|
| 2005/0212913 A1* | 9/2005 | Richter | G06K 9/00228 348/170 |
| 2005/0265395 A1 | 12/2005 | Kim et al. | |
| 2006/0085534 A1 | 4/2006 | Ralston et al. | |
| 2007/0078948 A1 | 4/2007 | Julia et al. | |
| 2007/0097268 A1 | 5/2007 | Relan et al. | |
| 2007/0121651 A1 | 5/2007 | Casey et al. | |
| 2008/0141303 A1 | 6/2008 | Walker et al. | |
| 2010/0223407 A1 | 9/2010 | Dong et al. | |
| 2010/0232518 A1 | 9/2010 | Coleman, Sr. | |
| 2011/0069131 A1* | 3/2011 | Tamura | B41J 2/355 347/189 |
| 2011/0078532 A1* | 3/2011 | Vonog | G06F 3/1454 714/752 |
| 2011/0083145 A1 | 4/2011 | Cholas et al. | |
| 2011/0119725 A1 | 5/2011 | Roberts et al. | |
| 2012/0050457 A1 | 3/2012 | Gu | |
| 2012/0069131 A1* | 3/2012 | Abelow | G06Q 10/067 348/14.01 |
| 2012/0072529 A1 | 3/2012 | Ahopelto | |
| 2012/0185530 A1 | 7/2012 | Reza | |
| 2013/0054827 A1 | 2/2013 | Feher et al. | |

FOREIGN PATENT DOCUMENTS

| | | |
|---|---|---|
| EP | 2448287 A1 | 5/2012 |
| RU | 2405267 C2 | 11/2010 |
| RU | 2015143011 A | 5/2017 |
| RU | 2662731 C2 | 7/2018 |
| WO | WO-02/23375 A2 | 3/2002 |
| WO | WO-03/005228 A1 | 1/2003 |
| WO | WO-2009009106 A1 | 1/2009 |
| WO | WO-2010/062761 A1 | 6/2010 |
| WO | WO-2012/126964 A1 | 9/2012 |

OTHER PUBLICATIONS

Examination Report under Section 18(3) issued by the United Kingdom Intellectual Property Office in relation to United Kingdom Application No. GB1307342.4 dated Nov. 24, 2016 (4 pages).
GB Examination Report under Section 18(3) issued by the Intellectual Property Office in relation to GB Application No. GB1307342.4 dated Nov. 12, 2015 (4 pages).
Combined Search and Examination Report under Sections 17 and 18(3) in connection with Application No. GB1307342.4 dated Oct. 22, 2013 (7 pages).
Russian Office Action issued by the Patent Office of the Russian Federation in relation to Russian Application No. 2015143011/07 dated Nov. 7, 2017 (7 pages) along with English language (5 pages).
International Search Report for International Application No. PCT/EP2014/001051, dated Jun. 30, 2014 (4 pages).
Written Opinion of the International Searching Authority for International Application No. PCT/EP2014/001051, dated Jun. 30, 2014 (5 pages).
Written Opinion of the International Preliminary Examining Authority (PCT Rule 66) for International Application No. PCT/EP2014/001051 dated Mar. 19, 2015 (10 pages).
Notification of Transmittal of the International Preliminary Report on Patentability (PCT Rule 71.1) for International Application No. PCT/EP2014/001051 dated Jul. 3, 2015 (11 pages).
Chinese Office Action issued by the State Intellectual Property Office (SIPO) in relation to Chinese Patent Application No. 201480035944.0 dated Dec. 29, 2017 (5 pages).
Summary of the Relevance of the Chinese Office Action (1 page).
European Communication, Examination Report dated Jan. 25, 2018 in corresponding European Patent Application No. 14719625.7.
Decision to Grant a Patent for an Invention issued by the Patent Office of the Russian Federation (ROSPATENT) in relation to Russian Application No. 2015143011/07 dated May 30, 2018 (12 pages) along with English language translation (2 pages).

* cited by examiner

SERVER NODE ARRANGEMENT AND METHOD

CROSS-REFERENCE TO RELATED APPLICATIONS

This application is a continuation of PCT International Patent Application No. PCT/EP2014/001051 filed Apr. 21, 2014, which claims the benefit of GB Patent Application No. 1307342.4 filed on Apr. 23, 2013, the entire disclosure of each of which is incorporated herein by reference.

TECHNICAL FIELD

The present disclosure relates to server node arrangements, for example to server node arrangements which are operable to receive input data from multiple input devices and process the input data and to output corresponding output data, wherein the output data includes various types of data, for example graphical data, audio data, or other content in any dimension. Moreover, the present disclosure concerns methods of operating the aforesaid server node arrangements, for example methods of operating server node arrangements for receiving input data from multiple input devices and processing the input data and to output corresponding output data, wherein the output data includes various types of data, for example graphical data, audio data, or other content in any dimension. Furthermore, the present disclosure relates to software products recorded on machine-readable data storage media, wherein the software products are executable upon computing hardware for implementing the aforesaid methods.

BACKGROUND INFORMATION

Contemporary situations arise where it is desirable to combine input content from a plurality of input sources into a single output content without distorting the input content, for example without adding temporal latency to the input content or influencing its pixel resolution. Moreover, many situations do not require the combined output data to be stored, whereas other situations require storage of the combined output data for replay purposes. Such storage is beneficially achieved whilst preserving original accuracy, for example resolution, for high quality playback purposes.

Figure 1:
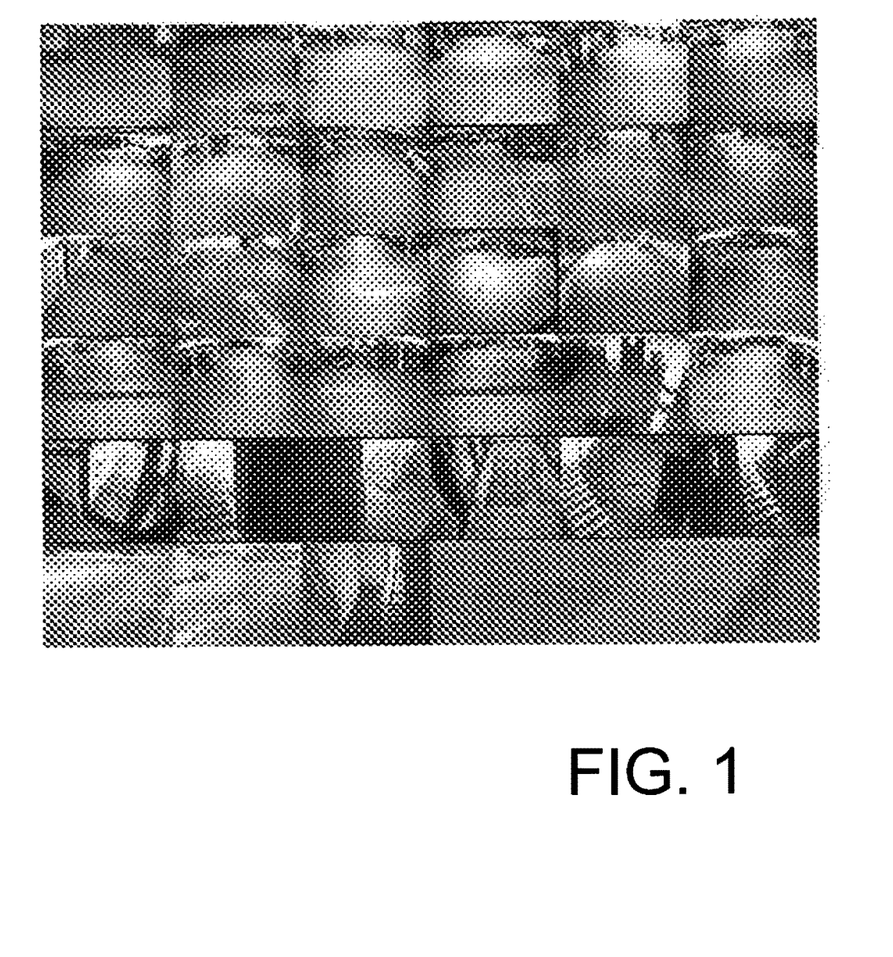
FIG. 1 is an illustration of a mosaic of images.

Contemporary installations often include a myriad of input devices and data collection devices, for example analog and/or digital cameras connected to surveillance arrangements such as video recording systems; such video recording systems optionally include digital video recorders (DVR), network video recorders (NVR), or personal video recorders (PVR). The contemporary installations are expensive and time consuming to construct for high quality surveillance purposes, because each source of input data is customarily connected to its own monitor, or several sources of input data are all collected together in a high-resolution manner in order to utilize a shared monitor, wherein a mosaic picture is created showing images from all of the sources of input data. Referring initially to FIG. 1, there is shown an illustration of a mosaic image generated by a vehicle park surveillance service setup, wherein the mosaic includes outputs from thirty three (33) sources of input data. Alternatively, situations arise where it is desirable to collect audio data from a plurality of audio sources generating high-quality audio data; in such a situation, it is often desirable to select amongst the audio sources for being monitored, or it is desired to sum audio content from the audio sources, for example condenser microphones spatially disposed amongst an orchestra, to generate an overall high-quality composite signal to be appreciated by a multitude of people, for example as in digital broadcast of an orchestral concert.

There is currently a lack of cost-effective contemporary systems that are operable to handle a plurality of high-quality data from corresponding input sources, and that are devoid of many devices for conditioning and conveying the high-quality data. Contemporary video conferencing systems and applications usually support various types of devices and sources of input data, and usually different conferencing systems are linked mutually to work together. Such video conferencing systems are capable of being configured in an enormous number of potential combinations, which creates a problem of implementing efficient communication within such systems. It is conventional practice to employ a mutually common communication protocol within the systems, although certain sources of input data are transcoded to a negotiated format, which can result in degradation of certain images communicated via the systems.

Mobile wireless communication devices, for example smart phones, tablet computers, phablet computers, lap-top computers, and wireless wrist-worn computers, are operable to generate, for example, content in a form of images, video, other photographic information, and audio data. Handling graphical content within such mobile devices consumes considerable power, which has implications for batteries employed to provide operating power to the mobile devices, for example when content is decoded and scaled to a desired size for presentation on pixel displays of the mobile devices. The aforesaid power consumption represents a problem when such mobile devices are operated in a configuration, for example for providing video conferencing-type services for a group of users.

SUMMARY

The present disclosure seeks to provide an improved server node arrangement which is capable of reducing processing requirements of rendering devices which are operable to render content data received thereat from the server node arrangement.

The present disclosure also seeks to provide an improved surveillance system and/or video conferencing system.

The present disclosure seeks to provide an improved method of operating a server node arrangement which is capable of reducing processing requirements of rendering devices which are operable to render content data received thereat from the server node arrangement.

According to a first aspect, there is provided a server node arrangement including one or more servers, the server node arrangement being coupled via a communication network to a plurality of sources of input data, and to one or more output devices, wherein the server node arrangement is operable to receive data content from the plurality of sources of input data, to process the data content for supplying to at least a subset of the one or more output devices, wherein the server node arrangement is operable to host one or more processes which are operable to process the data content into a form which is compatible to a native data rendering format of the subset of the one or more output devices, and wherein the at least a subset of the one or more output devices are operable to render the data content simultaneously.

Optionally, the server node arrangement is operable to convert data streams from the plurality of sources in real-time and to provide the data content corresponding to the data streams in native formats of the subset of the one or more output devices also in real-time.

Optionally, the subset of the one or more output devices are operable to render the data content in real-time.

Optionally, the server node arrangement is operable to combine the data content received from the plurality of sources to generate a combined signal for supplying to the at least a subset of the one or more output devices.

Optionally, in the server node arrangement, the plurality of sources include one or more cameras, and the at least a subset of the one or more output devices are operable to render one or more images collected from the one or more cameras simultaneously.

Optionally, in the server node arrangement, the one or more images are collected from a same camera, thereby showing temporal changes within a given scene.

Optionally, in the server node arrangement, the plurality of sources include one or more audio sources, and the at least a subset of the one or more output devices are operable to render one or more audio signals collected from the one or more audio sources simultaneously.

The present invention is of advantage in that processing the content data at the server node arrangement into a format which is natively compatible with the one or more source devices is capable of saving computing effort.

In practice, the native data rendering format is often RGB or YUV2, but typically the image is delivered in compressed format using an appropriate resolution. Such a situation, for example, corresponds to being compatible with a native data rendering format. Beneficially, the format is easy to convert from the delivered form to the native data rendering format within minimal amount of processing needed in the one or more output devices, for example decompression and possible colour conversion. Beneficially, the data content is supplied to a rendering device in a requested form that is a native format, compressed format or similar that is most suitable for the rendering device.

Optionally, the server node arrangement is operable to implement the one or more processes as a surveillance system.

Optionally, the server node arrangement is operable to implement the one or more processes as a video conferencing system.

Optionally, the server node arrangement is implemented such that the one or more servers are, at least in part, implemented in the one or more output devices and/or the plurality of sources.

Optionally, the server node arrangement is also used, for example, in TV/video broadcasting/multicasting, namely for applications that include simultaneous source cameras and/or video sources. The server node arrangement is also suitable for image browsing over the Internet using simple devices that obtain information from multiple images which are properly created for needs of the display. In some solutions, a resolution and a format for the display is fixed or includes only few choices, for example a standard setting, and the content is created for the solution; in some solutions, a given device has to deliver information of the display (or window) resolution and format the information to the server node arrangement to enable proper adjustments to be performed. Sometimes, some or all users have access to adjust the visibility of each source separately in their display, and this information is also needed to be delivered to the server node arrangement.

Optionally, in the server node arrangement, the one or more output devices are operable to define in a message to the server node arrangement one or more parameters which define one or more native formats in which the one or more output devices require their content data to be supplied from the server node arrangement.

Optionally, the server node arrangement is operable to supply the processed content data to the at least a subset of one or more output devices in a manner compatible with a region-of-interest (ROI) of the subset of the at least a subset of the one or more output devices.

Optionally, the server node arrangement is implemented, at least in part, in a cloud computing environment.

Optionally, the server node arrangement is operable to store content data from the one or more sources of input data in its original resolution, and to supply the content data to the at least a subset of the one or more output devices in a format which is compatible with a native format of the one or more output devices.

Optionally, in the server node arrangement, the content data includes at least one of: images, video, audio, sensor signal data, text data.

Optionally, the server node arrangement is operable to process content data therethrough in a manner allowing for dynamically-changeable image rescaling in response to user input at the at least a subset of the one or more output devices.

According to a second aspect, there is provided a method of processing data in a server node arrangement including one or more servers. The server node arrangement is coupled via a communication network to a plurality of sources of input data, and to one or more output devices, wherein the server node arrangement is operable to receive data content from the plurality of sources of input data, to process the data content for supplying to at least a subset of the one or more output devices, wherein the method includes hosting one or more processes at the server node arrangement which are operable to process the data content into a form which is compatible to a native data rendering format of the subset of the one or more output devices, and rendering the data content at the at least a subset of the one or more output devices simultaneously.

Optionally, the method includes operating the server node arrangement to convert data streams from the plurality of sources in real-time and to provide the data content corresponding to the data streams in native formats of the output devices also in real-time.

Optionally, the method includes operating the subset of the one or more output devices to render the data content in real-time.

Optionally, the method includes operating the server node arrangement to combine the data content received from the plurality of sources to generate a combined signal for supplying to the at least a subset of the one or more output devices.

Optionally, the method includes rendering one or more images at the at least a subset of the one or more output devices simultaneously, wherein the one or more images are collected from one or more cameras included within the plurality of sources.

Optionally, the method includes collecting the one or more images from a same camera and showing temporal changes within a given scene.

Optionally, the method includes rendering one or more audio signals at the at least a subset of the one or more output devices simultaneously, wherein the one or more audio signals are collected from one or more audio sources included within the plurality of sources.

Optionally, the method includes operating the server node arrangement to implement the one or more processes as a surveillance system.

Optionally, the method includes operating the server node arrangement to implement the one or more processes as a video conferencing system.

Optionally, the server node arrangement is also used, for example, in TV/video broadcasting/multicasting, namely for applications that include simultaneous source cameras and/or video sources. The server node arrangement is also suitable for image browsing over the Internet using simple devices that obtain information from multiple images which are properly created for needs of the display. In some solutions, a resolution and a format for the display is fixed or includes only few choices, for example a standard setting, and the content is created for the solution; in some solutions, a given device has to deliver information of the display (or window) resolution and format the information to the server node arrangement to enable proper adjustments to be performed. Sometimes, some or all users have access to adjust the visibility of each source separately in their display, and this information is also needed to be delivered to the server node arrangement.

Optionally, the method includes implementing the server node arrangement wherein the one or more servers are, at least in part, implemented in the one or more output devices and/or the plurality of sources.

Optionally, the method includes operating the one or more output devices to define in a message to the server node arrangement one or more parameters which define one or more native formats in which the one or more output devices require their content data to be supplied from the server node arrangement.

Optionally, the method includes operating the server node arrangement to supply the processed content data to the at least a subset of one or more output devices in a manner compatible with a region-of-interest (ROI) of the subset of the at least a subset of the one or more output devices.

Optionally, when implementing the method, the server node arrangement is implemented, at least in part, in a cloud computing environment.

Optionally, the method includes operating the server node arrangement to store content data from the one or more sources of input data in its original resolution, and supply the content data to the at least a subset of the one or more output devices in a format which is compatible with a native format of the one or more output devices.

Optionally, when implementing the method, the content data includes at least one of: images, video, audio, sensor signal data, text data.

Optionally, the method includes operating the server node arrangement to process content data therethrough in a manner allowing for dynamically-changeable image rescaling in response to user input at the at least a subset of the one or more output devices.

According to a third aspect, there is provided a non-transitory computer-readable storage medium including a set of computer-readable instructions stored thereon, which, when executed by a processing system, cause the processing system to perform the steps of hosting one or more processes at a server node arrangement which are operable to process data content into a form which is compatible to a native data rendering format of a subset of the one or more output devices; and rendering the data content at the at least a subset of one or more output devices simultaneously.

It will be appreciated that features of the invention are susceptible to being combined in various combinations without departing from the scope of the invention as defined by the appended claims.

BRIEF DESCRIPTION OF THE DRAWINGS

Embodiments will now be described, by way of example only, with reference to the following drawings, wherein.

In the accompanying drawings, an underlined number is employed to represent an item over which the underlined number is positioned or an item to which the underlined number is adjacent. A non-underlined number relates to an item identified by a line linking the non-underlined number to the item. When a number is non-underlined and accompanied by an associated arrow, the non-underlined number is used to identify a general item at which the arrow is pointing.

DETAILED DESCRIPTION

In describing embodiments, abbreviations will be used as defined in Table 1.

TABLE 1

Abbreviations and acronyms

| Abbreviation or acronym | Definition |
| --- | --- |
| BGR24 | Blue-Green-Red in a 8 bit x 8 bit x 8 bit format |
| CAT | Category 5 cable is a twisted pair cable for carrying signals |
| DVR | Digital Video Recorder |
| H.264 | H.264/MPEG-4 Part 10 or AVC (Advanced Video Coding) is a standard for video compression, and is a common contemporary format for recording, compression and distribution of high definition video |
| IP | Internet Protocol |
| MJPG | Motion JPEG (M-JPEG or MJPEG) is a video format in which each video frame or interlaced image field of a digital video sequence is separately compressed at a JPEG image |
| NVR | Network Video Recorder |
| PVR | Personal Video Recorder |
| LAN | Local Area Network (for example IEEE802) |
| ROI | "Region of Interest" used in this disclosure to describe a region of interest of a graphical display of an output device, or a region of interest within a spatial region, for example a geographical region |
| YCbCr | A family of color spaces used as a part of a color image pipeline in video and digital photographic systems, wherein Y' is a luma component, and Cb and Cr are blue-difference and red-difference chroma components respectively |
| YUV | A color space typically used as a part of a color image pipeline, wherein a color image or video taking human perception into account is encoded, providing as a benefit reduced bandwidth requirements for chrominance components when communicating corresponding encoded data, thereby enabling transmission errors or compression artefacts to be often more efficiently masked by human perception than used a "direct" RGB-representation |
| WLAN | Wireless Local Area network (for example IEEE 802.11) |

Figure 2A:
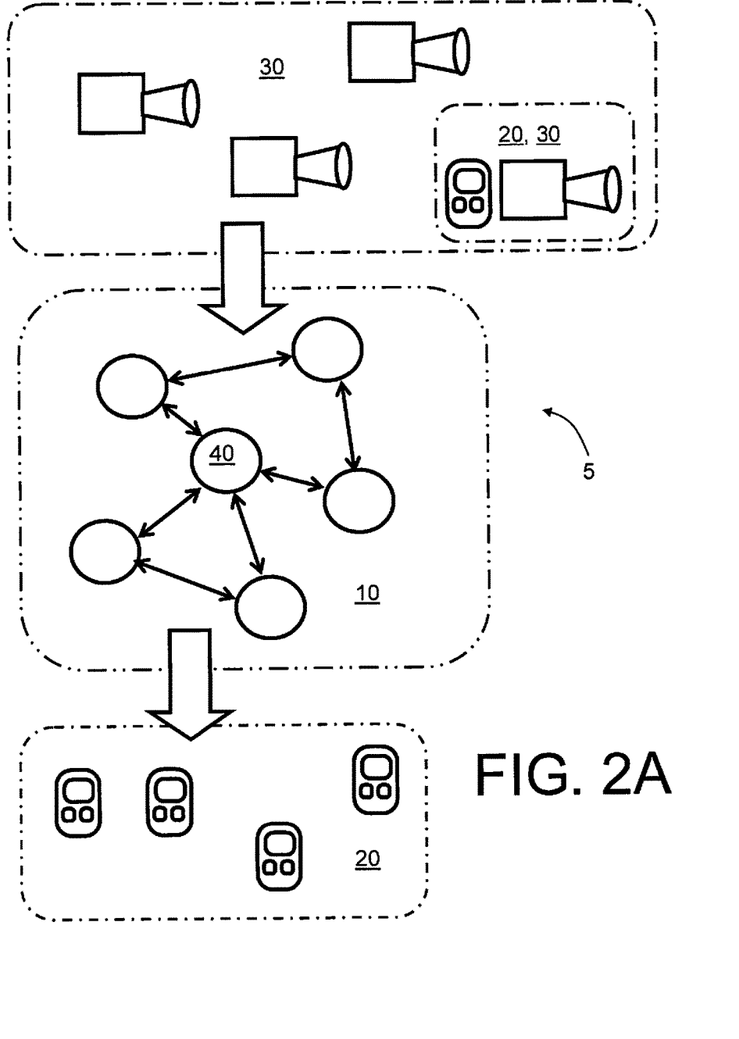
FIG. 2A is an illustration of a system including a server node arrangement for providing processing of data communicated therethrough.
Figure 2B:
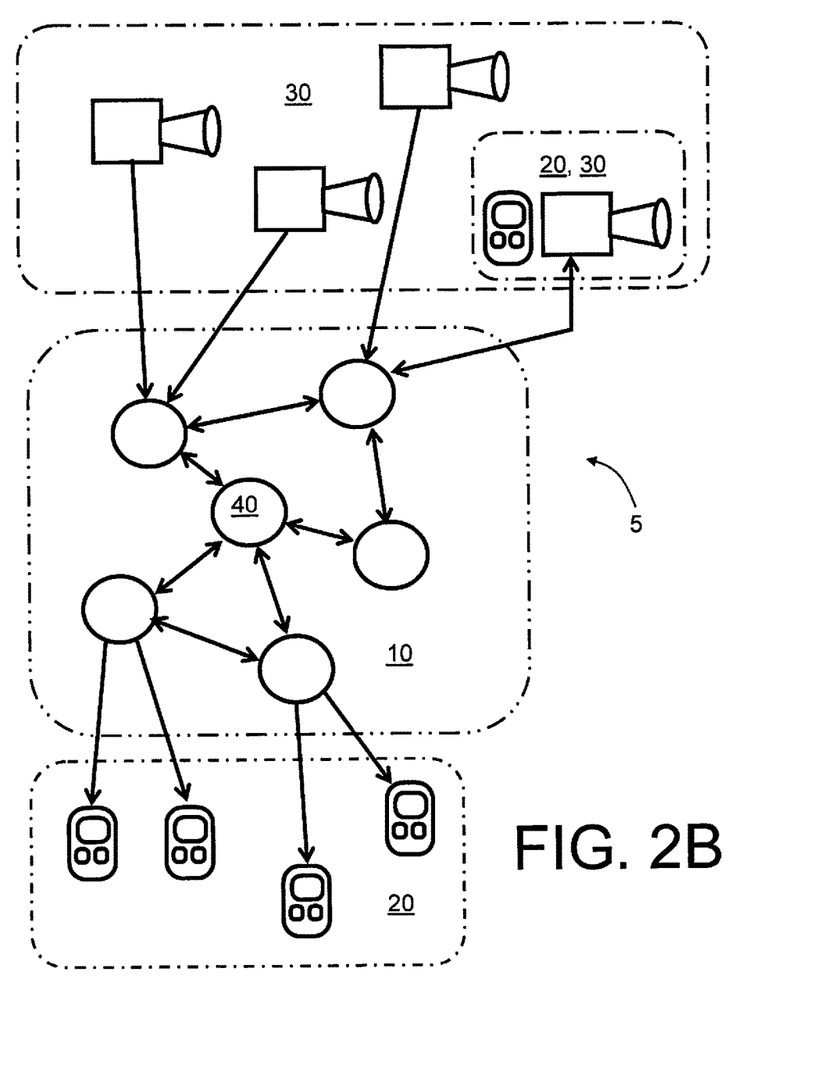
FIG. 2B is an illustration of a system including a server node arrangement for providing processing of data communicated therethrough.

In overview, with reference to FIG. 2A and FIG. 2B, the disclosure is concerned with a system indicated generally by 5. The system 5 comprises a server node arrangement denoted by 10 which is operable to provide a simple and effective method of outputting various kinds of graphical content, audio content and/or other types of content in any dimension in one or more output devices 20, wherein the content for the one or more output devices 20 is derived from multiple sources 30 of input data on demand, for example for live monitoring and/or playback purposes. The method beneficially employs parallel data processing techniques that are controlled from the server node arrangement 10, for example from a controlling server node 40 thereof, wherein the techniques are executed in a given output device 20, namely "client", in a server of the server node arrangement 10 or in combination thereof. Optionally, the server node arrangement 10 includes one or more data servers. Optionally, a sub-set of the one or more data servers is implemented as one or more cloud servers. Optionally, the server node arrangement 10 is implemented, at least in part in a source of input data, namely in at least one client device. Optionally, a server node of the server node arrangement 10 is located in a transmitting client device, and also in the receiving device, even though this is potentially not an optimal solution. Moreover, the server node arrangement 10 beneficially includes one or more servers, of which, optionally, one or more servers are located in a cloud computing environment. Furthermore, one or more client devices can be either a source client or a destination client, or any combination thereof.

Optionally, the multiple sources 30 include at least one camera, and that multiple images are collected from that at least one camera which are replayed at different times within the system 5 when in operation: for example, multiple images from a same camera can be displayed by the system 5 to show temporal changes within a given scene, for example such changes corresponding to a disappearance of an item from the given scene, for example corresponding to an act of theft.

In FIG. 2A and FIG. 2B, the server node arrangement 10 beneficially includes a plurality of server nodes, for example, to spread computing effort. One output device 20 optionally functions as a multicast client that receives content data from a single server node, and the output device 20 can then deliver the content data to multiple destination output devices 20, or multiple destination output devices 20 coupled in a mutually common spatially local network, for example, a mutually common local area network (LAN).

Optionally, a given source 30 of input data is operable to deliver content data from multiple sources 30 of input data to the server node arrangement 10. Moreover, optionally, a given device coupled to the server node arrangement 10 is capable of operating as an input and output proxy server. Moreover, the sources 30 of input data can be any device or software processing executing upon computing hardware which is operable to output analog or digital signals including image information, video information and other graphics information.

Beneficially, in the system 5 as illustrated in FIG. 2A and FIG. 2B, including the sources 30 of input data and the output devices 20 together with the server node arrangement 10, is capable in operation to save a large amount of communication bandwidth provided within the system, because the output content for each destination client is constructed and encoded especially taking into account data processing capabilities of individual rendering devices and/or software employed for implementing the system. Optionally, a server node of the server node arrangement 10 is located in a transmitting client device, and/or also in the receiving device, even though the latter is potentially not an optimal solution.

The system 5 in FIG. 2A and FIG. 2B is capable of handling data from a diverse range of source devices, for example a camera input, desktop content, 3-D camera inputs and microphone inputs. Moreover, output devices in FIG. 2A and FIG. 2B include, for example, internal (in-device) displays, external displays, 3-D displays, 3-D printers, loudspeakers, and similar devices. For example, for effective 3-D printing, it is possible that a printed 3-D object is generated from a diverse range of sources such as cameras or files.

The system 5 in FIG. 2A and FIG. 2B is operable such that rendering client devices, for example the output devices 20, require less decoding capacity, because content is delivered to them via the server node arrangement 10 in a desired encoded format, size and quality for a specified region of interest (ROI), for example content from one or more surveillance cameras providing images from a spatial region to be monitored for security purposes against theft. Moreover, audio data is delivered in a desired format and quality for output devices 20 or destination clients. In operation, the system is capable of avoiding problems arising when a content encoding format is not supported in device decoders, for example in one or more of the output devices 20, or the content is incompatible for other unknown reasons. Similarly, decoding and processing of other types of data does not consume more resources than necessary in the system, and usually no transcoding is necessary. Moreover, less communication bandwidth is required when transferring data within the system when contents are delivered in respect of a desired region of interest (ROI) or quality, as compared in contradistinction to a situation wherein all images or data are delivered in full accuracy from all sources of input data to all output devices, namely rendering clients. Thus, in the system of FIG. 2A and FIG. 2B, the rendering client can request images, video, other graphical data and/or audio data on demand from the server node arrangement 10 which adapts supplied content specifically to the needs of the rendering client.

In the system 5 of FIG. 2A and FIG. 2B, any sort of analog or digital image, video, graphics data, and audio input that are connected to the system 5 can be utilized as sources of input data, namely sources 30. For example, first thirty cameras providing a first thirty images presented in FIG. 1 are analog, and they are each coupled in communication with the server node arrangement 10 via coaxial cable arrangement connection to a digital capture electronic circuit board (card) arrangement of a surveillance system hosted by the system 5. This digital capture circuit board arrangement is operable to transform analog image signals into a digital YCbCr format, also known as a YUV2 format. Moreover, a last three cameras providing the mosaic of images in FIG. 1 are digital cameras, wherein two of the digital cameras have been connected via a CAT 5 network cable and one of the digital cameras has been connected via a wireless data link, for example utilizing WLAN protocol, accommodated in a local area network (LAN) of the system 5.

The digital cameras, for example when implemented as "IP cameras", of the system 5 differ from the analog cameras in that the digital cameras are not required to be used in combination with the aforesaid digital capture card arrangement, because the digital cameras include digital processing circuits within their housings, and their outputs are thus already encoded to digital format, for example YCbCr, RGB, MJPG or H.264. The system 5, as aforementioned, is capable of accommodating other types of sources of input data, for example audio and graphics input sources, wherein their outputs are beneficially processed in a similar manner to aforesaid surveillance cameras, but in their own native formats; in other words, the system 5 is operable to interpret input data to the server node arrangement 10 in such a way that it can be effectively decoded for constructing corresponding output signals to be provided to the output devices 20.

If one or more input signals from the sources 30 are transmitted via the server node arrangement 10 to more than one rendering device, for example more than one output device 30, the system 5 is operable to decompress the input signals only once, when the input signals are provided in a compressed manner to the server node arrangement 10, and corresponding decompressed information stored in a memory cache as long as a new input signal replaces the old one. Even though the decoded input signal replaces the input signal that was previously decompressed, there are operating situations in the system 5, wherein the signals are not always decompressed, for example in an event that there are no output devices 20 that require the input signal in a decompressed format or with different resolution. Thus, one or more input signals received from the one or more sources 30 are decoded within the server node arrangement 10 only when one or more of the output devices 20 require such a decompressed form of content to be provided to them. Decoding within the server node arrangement 10 is not required at all, requiring the one or more output devices 20 to decode data thereat, when all the rendering devices, for example all the output devices 20, request the input data generated by one or more of the sources 30 from the server node arrangement 10 with a mutually similar resolution and in a format as delivered from the one or more sources 30 to the server node arrangement 10.

On account of server node arrangement 10 including computing hardware which is operable to execute one or more software products in order to provide its processing functionalities, the server node arrangement 10 can be configured to process data received from the one or more sources 30 of input data into various forms which are requested by one or more of the output devices 20, namely rendering devices. On such functionality provided by the server node arrangement 10 is a "Mixin" functionality, wherein the system 5 is operable to generate a combination of decompressed input signals provided from the one or more sources 30 to generate a collection signal, referred to as a "Mixin signal". Moreover, for the Mixin functionality, the server node arrangement 10 is operable to encode and/or decode the Mixin signal into a format that is optimal for a given output device 20, namely rendering device. The rendering device defines, for example in a request message sent from the rendering device to the server node arrangement 10, the location of one or more signals (ROI, Region of Interest) as well as a quality of audio content required, and the system 5 is operable to collect corresponding pertinent input signals from sources 30 by decompressing and transforming, where appropriate, their native format into an optimal format defined by a coding method employed in the rendering device.

An important functionality of the system 5, as aforementioned, is to combine signals from the sources 30 of input data, for example by employing data processing techniques such as resizing images and oversampling images and/or audio signals, for generating a combined signal, for example the Mixin signal, for a given region of interest (ROI) to the one or more output devices 20. For example, in the system 5, input image signals are combined at the server node arrangement 10 with an output collection signal by employing a resize function provided in the server node arrangement 10, for example by employing, for example, a super-sampling computing algorithm, a cubic or a linear method; it is thereby feasible to retain a signal quality which is as high as practically possible before combining the input image signals and output collection signal to provide a final output signal for sending to the output devices 20.

The system 5 is beneficially operable to employ encoding using an encoding method which is best suited for each rendering device, for example output device 20, for example customized to each output device 20 at the server node arrangement 10 in response to each device making its encoding requirements known to the server node arrangement 10 by sending an encoding request message thereto. Thus, the server node arrangement 10 is capable of creating a dedicated output which is customized for each of the output devices 20, or groups of such output devices 20 which have mutually similar encoding requirements.

In operation of the system 5, occasions arise where audio data, and other types of data, need to be combined. Many types of data can simply be assembled together to generate combined data, for example concatenated audio data files. In other situations, temporal merging of data files is required, for example a plurality of audio files are combined temporally in parallel to generate combined data, for example mixing of individual microphone signals during recording of an orchestral concert to generate an overall recording of the concert. Such mixing and combination of signals is a functionality provided by the system 5. When multiple audio signals are mutually combined, it is beneficial to utilize methods which preserve original audio volume, yet without adding additional or excessive noise. In an example where the multiple audio signals correspond to multiple persons speaking together in conference, it is advantageous that the system 5 adjust a relative volume of the voices of the person so that they are mutually similar in volume, for example in a telephone conferencing situation or a video conferencing situation. In another example, a selection of an audio source for conveying to the output devices 20 is based upon a most active camera source and/or on a highest volume audio source, for example where the system 5 is required to function as an intruder surveillance system.

When the system 5 is employed for video conferencing purposes, the sources 30 and the output devices 20 are beneficially pre-defined. A communication device of a given user participating in such a video conference may optionally act as both an output device 20 as well as a source 30 of input signals to the system 5; similar considerations pertain mutatis mutandis to telephone conferencing. In surveillance applications, the output devices 20 and the sources 30 may be at mutually different locations. In certain situations, the output devices 20 each have a mutually different region of interest (ROI) and thus each require signals from a different combination of sources 30. Such flexibility is accommodated by the system 5. Thus, beneficially, a process executing in the system 5 requests a resolution required for region of interest (ROI) from the render device for a given desired output signal. The region of interest (ROI) can also pertain to an area of a display of a given output device 20 for which image data being processed by the server node arrangement 10 is to be adapted for presentation at the output device 20. For example, a native display resolution of a given output device 20 is 800 pixels×480 pixels, and is communicated to one or more processes executing upon the server node arrangement 10 as being a region of interest (ROI). In certain situations, a display area, namely "window", of a given output application may be potentially smaller than the native resolution of the display, requiring scaling up of content image for presentation, by employing for example a cubic or a linear method; as aforementioned, such scaling up is beneficially executed at the server node arrangement 10, or by a combination of processing in the server node arrangement 10 and the given output device 20 having the aforesaid native display resolution. Optionally resizing of content received at the output device 20 is performed by processing in computing hardware included in the output device 20. Scaling down is needed when the native resolution in presentation and/or region of interest (ROI) "window" is smaller than the resolution of the input source/sources. This resizing is also beneficially executed at the server node 10, but optionally it can also be performed by processing data in computing hardware included in the output device 20.

The system 5 is capable of operating to generate the mosaic of images as illustrated in FIG. 1, as aforementioned. Moreover, the system 5 is operable to generate the mosaic to include content from any number of sources 30 of input data, for example digital video cameras and/or analog video cameras. Furthermore, the mosaic can be beneficially rearranged as required under software control in a flexible manner, for example to ease human strain when monitoring the images, for example at a surveillance control centre. The mosaic is generated in real-time and is illustrated to have a 6×6 image format, but is reconfigurable, if required, to other formats, for example 1×1, 1×2, 2×3, 9×6 and so forth. Moreover, the size of images in the mosaic can vary; for example thirty three images in FIG. 1 can also be represented as a single big image that uses an area of four small images together with thirty two smaller images. There can be many different sizes of images in the mosaic image and the aspect ratios of the images can also be varies. The arrangement of images, optionally, can vary dynamically based on the user needs and the variations will be informed to the server node arrangement to enable optimal data "Mixin" and data delivery.

Aforementioned embodiments are capable of saving considerable amounts of computing capacity at a rendering device of the system 5, namely one or more of the output devices 20. Such saving is achieved by the server node arrangement 10 constructing and returning to the rendering device exactly the desired size of content in a suitable format for the rendering device. Such computation savings potentially increase operating reliability of the system 5, because a large amount of the data processing required is executed in a centralized manner at one or more server nodes of the server node arrangement 10. Moreover, such centralized processing decreases a processing capacity required in rendering devices, namely the output devices 20. Moreover, the system 5 is capable of saving a considerable amount of energy associated with processing data for following reasons:

(i) a given rendering device of the system 5 decompresses content received thereat in a native raw format, thereby avoiding a need to consume power at the rendering device for transformation operations; and
(ii) the given rendering device is capable of using the content received thereat directly, without needing to scale the content, thereby avoiding a need for post-processing in the given rendering device.

When the rendering device is a low-power portable device, such reduction in power consumption associated with data processing potentially enables the rendering devices to continue operating from battery power sources for longer periods, before the associated batteries need to be replaced or recharged. Moreover, the system 5 is capable of reducing a volume of data to be communicated from the server node arrangement 10 to the one or more output devices 20, namely rendering devices, because the region of interest (ROI) of a given rendering device is often much smaller than the combined contents. For example, if thirty items of analog-to-digital (ADC) converted 750 pixel×576 pixel resolution images and three items of digital 1024 pixel×768 pixel resolution images are transmitted from thirty three surveillance cameras, as per FIG. 1, to a given rendering device whose display has a native resolution of 800 pixels×640 pixels, then the server node arrangement 10 in its processes saves both image area and communication transfer capacity by a factor of 38.4 times. Moreover, as aforementioned, the rendering device does not need to resize the images to fit into a smaller display screen of the rendering device. Embodiments as described in the foregoing are especially useful when implementing video surveillance systems, wherein video capture is stored in the server node arrangement 10, and where video output supplied from the server node arrangement 10 to one or more rendering devices can simultaneously be watched in real-time or playback modes. The video can, for example, be stored in full resolution at the server node arrangement 10, and supplied to the one or more rendering devices in a format which is efficient and suitable for them. Similar considerations pertain when the system 5 is employed for recorded video conferences.

The system 5 is capable of accomplishing automatic video image synchronization if a given rendering device receives one image at a time via a communication network coupling the server node arrangement 10 to the given rendering device, for example via the Internet, although other types of communication networks are additional or alternatively employed, for example proprietary customized communication networks, for example high-security dedicated networks. In this case, the server node arrangement 10 constructs the image to be encoded from each source 30 of input data in real-time.

The system 5 makes it possible to transmit real-time live content to several rendering devices, even when some of the rendering devices are slower in their ability to perform data processing in comparison to other of the rendering devices, because the server node arrangement 10 constructs encoded images in a customized manner for each rendering device as soon as it is requested by the rendering device; for example, the slower rendering devices do not delay a rate at which images are provided to the faster rendering devices. In such a manner of operation, the system 5 is capable of supporting rendering devices which are operable, in a manner akin to the sources 30, to transmit their own input signals to the server node arrangement 10, and then to receive a latest sent image for a precise region-of-interest (ROI) it desires to present on its graphical display.

The system 5 is thus capable of being used to provide two-way real-time communication between a plurality of participating parties, for example as in a video conference. Image processing executed in the server node arrangement 10, for example scaling, makes it possible to have a very large number of simultaneous participants with video connection. If several rendering devices have a mutually similar region of interest (ROI) on their graphical displays, it is feasible for the server node arrangement 10 to serve similar images to several mutually similar rendering devices, for example mutually-similar models of smart phone. Moreover, during video surveillance or a video conference, a given participating party can select to have a closer look at a particular camera image of interest in the mosaic, or studying facial features of a another participating party to the video conference; such flexibility is achieved by the rendering device of the given participating party sending a request to the server node arrangement 10 to process content for the rendering device of the given participating party in a modified manner, for example with different scaling and/or resolution. Such a modified manner of processing the content at the server node arrangement 10 is, for example, achievable by the given participating user applying a finger swiping motion to a touch screen of the rendering device of the given participating party, or using a mouse click or similar. Such modified manner of processing the content can also include using a modified aspect ratio to images, for anisotropic rescaling of defined image content and so forth, and/or performing color enhancement on certain portions of an image or sequence of video images, for example highlighting certain regions of the images.

Figure 3:
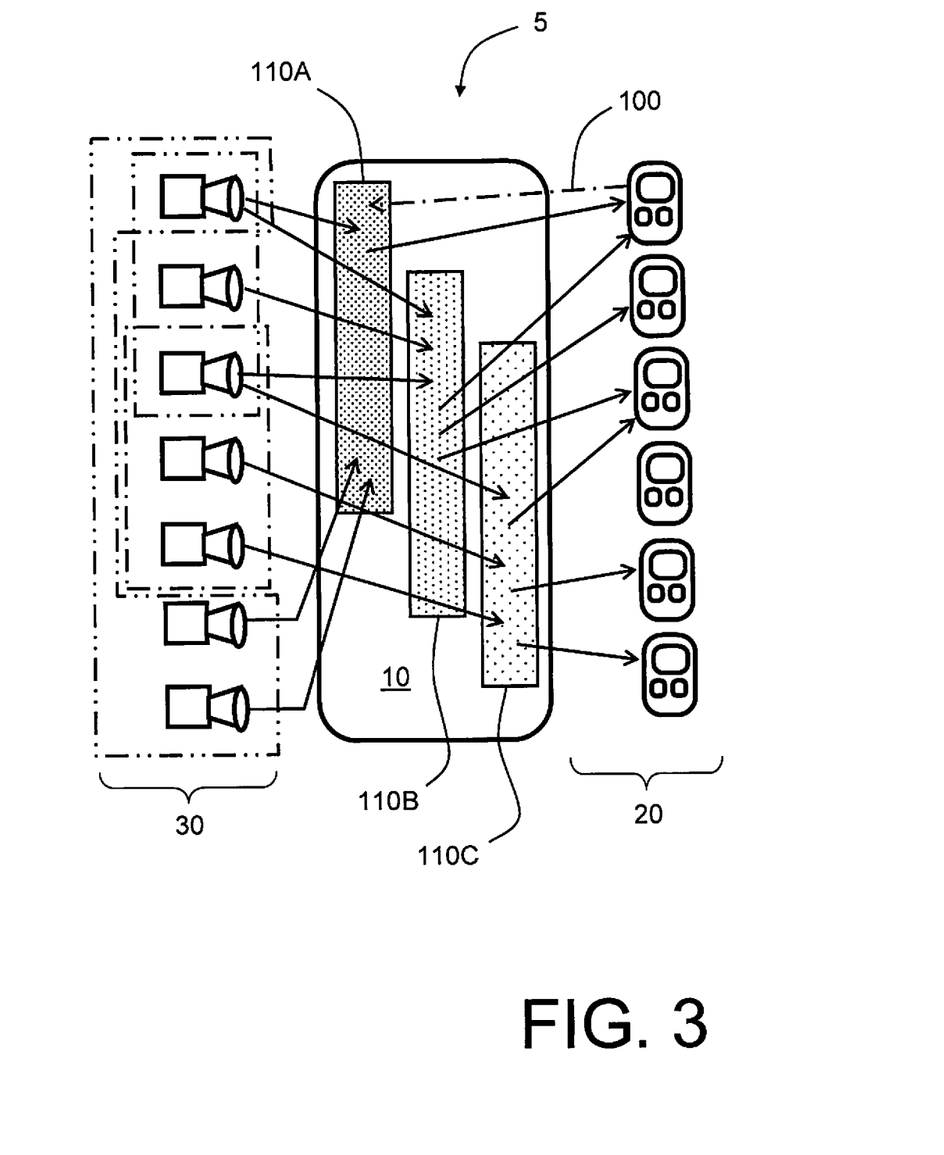
FIG. 3 is an illustration of data exchanges occurring within the system of FIG. 2A and FIG. 2B.

In FIG. 3, a rendering device, namely an output device 20, sends a request 100 to the server node arrangement 10 to supply data content in a defined manner for the output device 20 in relation to a specified process 110A hosted by the server node arrangement 10; for example, the specified process 110A is an occurrence of a video conference, a residential or vehicle park surveillance service or real-time relayed sporting events. The server node arrangement 10 is capable of supporting a plurality of processes 110A, 1108, 110C concurrently, wherein certain rendering devices can optionally subscribe to a plurality of processes simultaneously so that their users can switch rapidly between processes. Such switching is beneficial, for example, when the system 5 is employed to monitor and control a petrochemicals facility or a hospital facility wherein multiple activities are occurring simultaneously, for example mobile ambulance services and emergency and accident departments which are required to be coordinated with the mobile ambulance services.

The foregoing detailed description of embodiments are only examples. Although the specification may have referred to "an", "one", or "some" embodiment(s) in several locations, this does not necessarily mean that each such reference is to the same embodiment(s), or that the feature only applies to a single embodiment. Single features of different embodiments may also be combined to provide other embodiments. Furthermore, the words "comprising" and "including" should be understood as not limiting the described embodiments to consist of only those features that have been mentioned and such embodiments may also contain features, structures, units, and modules, etc. that have not been specifically mentioned.

It will be understood to a person skilled in the art that, as technology advances, the inventive concept may be implemented in various ways. The invention and its embodiments are not limited to the examples described above but may vary within the scope of the claims.

The invention claimed is:

1. A server node arrangement comprising:
a plurality of nodes,
the plurality of nodes of the server node arrangement are coupled via a communication network to a plurality of source devices of input data, and to one or more output devices, wherein the plurality of nodes of the server node arrangement are operable to receive data content from the plurality of source devices of input data, and to process the data content for supplying to the one or more output devices,
the plurality of nodes of the server node arrangement are operable to host one or more processes which are operable to:
determine a form which is compatible to a native data rendering format of the one or more output devices, wherein the form includes a native resolution of the one or more output devices, and
process the data content into the determined form and into the native resolution of the one or more output devices,
each of the one or more output devices is operable to render the data content from the plurality of source devices of input data simultaneously and without scaling the processed data content; and
the plurality of nodes of the server node arrangement are operable to supply the processed data content to the one or more output devices in a manner compatible with a region-of-interest (ROI) of the one or more output devices;
wherein the one or more output devices are operable to define in a message to the plurality of nodes of the server node arrangement one or more parameters which define one or more native formats in which the one or more output devices require their data content to be supplied from the server node arrangement;
wherein the plurality of nodes of the server node arrangement are operable to store data content from the one or more source devices of input data in its original resolution, and supply the data content to the one or more output devices in a format which is compatible with a native format of the one or more output devices;
wherein the plurality of nodes of the server node arrangement are operable to process data content there through in a manner allowing for dynamically-changeable image rescaling in response to user input at the one or more output devices.

2. The server node arrangement as claimed in claim 1, wherein the plurality of nodes of the server node arrangement are operable to combine the data content received from the plurality of source devices to generate a combined signal for supplying to the one or more output devices.

3. The server node arrangement as claimed in claim 1, wherein the plurality of source devices include one or more cameras, and the one or more output devices are operable to render one or more images collected from the one or more cameras simultaneously.

4. The server node arrangement as claimed in claim 3, wherein the one or more images are collected from a same camera, thereby showing temporal changes within a given scene.

5. The server node arrangement as claimed in claim 1, wherein the plurality of source devices include one or more audio sources, and the one or more output devices are operable to render one or more audio signals collected from the one or more audio source devices simultaneously.

6. The server node arrangement as claimed in claim 1, wherein the plurality of nodes of the server node arrangement are operable to implement the one or more processes as a surveillance system.

7. The server node arrangement as claimed in claim 1, wherein the plurality of nodes of the server node arrangement are operable to implement the one or more processes as a video conferencing system.

8. The server node arrangement as claimed in claim 1, wherein the plurality of nodes of the server node arrangement are operable to implement the one or more processes for TV/Video broadcasting/multicasting.

9. The server node arrangement as claimed in claim 1, wherein the plurality of nodes of the server node arrangement are operable to implement the one or more processes for image browsing via Internet.

10. The server node arrangement as claimed in claim 1, wherein the plurality of nodes of the server node arrangement include one or more servers, wherein the one or more servers are, at least in part, implemented in the plurality of source devices.

11. The server node arrangement as claimed in claim 1, wherein the plurality of nodes of the server node arrangement are implemented, at least in part, in a cloud computing environment.

12. The server node arrangement as claimed in claim 1, wherein the data content includes at least one of: images, video, audio, sensor signal data, text data.

13. A method of processing data in a server node arrangement having a plurality of nodes, the plurality of nodes of the server node arrangement being coupled via a communication network to a plurality of source devices of input data, and to one or more output devices, wherein the plurality of nodes of the server node arrangement are operable to receive data content from the plurality of source devices of input data, and to process the data content for supplying to the one or more output devices, the method comprising:
  hosting one or more processes at the plurality of nodes of the server node arrangement which are operable to:
    determine a form which is compatible to a native data rendering format of the one or more output devices, wherein the form includes a native resolution of the one or more output devices, and
    process the data content into the determined form and into the native resolution of the one or more output devices;
  rendering the data content from the plurality of source devices of input data at each of the one or more output devices simultaneously and without scaling the processed data content;
  operating the plurality of nodes of the server node arrangement to supply the processed data content to the one or more output devices in a manner compatible with a region-of-interest (ROI) of the one or more output devices;
  operating the one or more output devices to define in a message to the server node arrangement one or more parameters which define one or more native formats in which the one or more output devices require theft data content to be supplied from the server node arrangement;
  operating the plurality of nodes of the server node arrangement to store data content from the one or more source devices of input data in its original resolution, and supply the data content to the one or more output devices in a format which is compatible with a native format of the one or more output devices; and
  operating the plurality of nodes of the server node arrangement to process data content there through in a manner allowing for dynamically-changeable image rescaling in response to user input at the one or more output devices.

14. The method as claimed in claim 13, wherein the method further comprises operating the plurality of nodes of the server node arrangement to combine the data content received from the plurality of source devices to generate a combined signal for supplying to the one or more output devices.

15. The method as claimed in claim 13, wherein the method further comprises rendering one or more images at the one or more output devices simultaneously, wherein the one or more images are collected from one or more cameras included within the plurality of source devices.

16. The method as claimed in claim 15, wherein the method further comprises collecting the one or more images from a same camera; and showing temporal changes within a given scene.

17. The method as claimed in claim 13, wherein the method further comprises rendering one or more audio signals at the one or more output devices simultaneously, wherein the one or more audio signals are collected from one or more audio source devices included within the plurality of source devices.

18. The method as claimed in claim 13, wherein the method further comprises operating the plurality of nodes of the server node arrangement to implement the one or more processes as a surveillance system.

19. The method as claimed in claim 13, wherein the method further comprises operating the plurality of nodes of the server node arrangement to implement the one or more processes as a video conferencing system.

20. The method as claimed in claim 13, wherein the method further comprises operating the plurality of nodes of the server node arrangement to implement the one or more processes for TV/Video broadcasting/multicasting.

21. The method as claimed in claim 13, wherein the method further comprises operating the plurality of nodes of the server node arrangement to implement the one or more processes for image browsing via Internet.

22. The method as claimed in claim 13, wherein the method further comprises implementing the plurality of nodes of the server node arrangement so as to include one or more servers, wherein the one or more servers are, at least in part, implemented in the plurality of source devices.

23. The method as claimed in claim 13, wherein the plurality of nodes of the server node arrangement is implemented, at least in part, in a cloud computing environment.

24. The method as claimed in claim 13, wherein the data content comprises at least one of: images, video, audio, sensor signal data, text data.

25. A non-transitory computer-readable storage medium comprising a set of computer-readable instructions stored thereon, which, when executed by a processing system, cause the processing system to process data in a server node arrangement having a plurality of nodes, the plurality of nodes of the server node arrangement being coupled via a communication network to a plurality of source devices of input data, and to one or more output devices, wherein the plurality of nodes of the server node arrangement are operable to receive data content from the plurality of source devices of input data, and to process the data content for supplying to the one or more output devices, by performing the steps of: steps comprising:
  hosting one or more processes at the plurality of nodes of the server node arrangement which are operable to:
    determine a form which is compatible to a native data rendering format of the one or more output devices, wherein the form includes a native resolution of the one or more output devices, and
    process data content into the determined form and into the native resolution of the one or more output devices;

rendering the data content from the plurality of source devices of input data at each of the one or more output devices simultaneously and without scaling the processed data content;
operating the plurality of nodes of the server node arrangement to supply the processed data content to the one or more output devices in a manner compatible with a region-of-interest (ROI) of the one or more output devices;
operating the one or more output devices to define in a message to the server node arrangement one or more parameters which define one or more native formats in which the one or more output devices require theft data content to be supplied from the server node arrangement;
operating the plurality of nodes of the server node arrangement to store data content from the one or more source devices of input data in its original resolution, and supply the data content to the one or more output devices in a format which is compatible with a native format of the one or more output devices; and
operating the plurality of nodes of the server node arrangement to process data content there through in a manner allowing for dynamically-changeable image rescaling in response to user input at the one or more output devices.

* * * * *

UNITED STATES PATENT AND TRADEMARK OFFICE
CERTIFICATE OF CORRECTION

PATENT NO. : 10,250,683 B2
APPLICATION NO. : 14/885543
DATED : April 2, 2019
INVENTOR(S) : Karkkainen et al.

Page 1 of 2

It is certified that error appears in the above-identified patent and that said Letters Patent is hereby corrected as shown below:

In the Claims

Column 16, Line 46-Column 17, Line 26, (approx.):
The invention claimed is:
Claim 25:
"*A non-transitory computer-readable storage medium comprising a set of computer-readable instructions stored thereon, which, when executed by a processing system, cause the processing system to process data in a server node arrangement comprising having a plurality of nodes, the plurality of nodes of the server node arrangement being coupled via a communication network to a plurality of source devices of input data, and to one or more output devices, wherein the plurality of nodes of the server node arrangement are operable to receive data content from the plurality of source devices of input data, and to process the data content for supplying to the one or more output devices, by performing the steps of:*
*steps comprising:*
  *hosting one or more processes at the plurality of nodes of the server node arrangement which are operable to:*
  *determine a form which is compatible to a native data rendering format of the one or more output devices, wherein the form includes a native resolution of the one or more output devices, and*
  *process data content into the determined form and into the native resolution of the one or more output devices;*
  *rendering the data content from the plurality of source devices of input data at each of the one or more output devices simultaneously and without scaling the processed data content;*
  *operating the plurality of nodes of the server node arrangement to supply the processed data content to the one or more output devices in a manner compatible with a region-of-interest (ROI) of the one or more output devices;*
  *operating the one or more output devices to define in a message to the server node arrangement one or more parameters which define one or more native formats in which the one or more output devices require theft data content to be supplied from the server node arrangement;*
  *operating the plurality of nodes of the server node arrangement to store data content from the one or more source devices of input data in its original resolution, and supply the data content to the*

Signed and Sealed this
Second Day of July, 2019

Andrei Iancu
*Director of the United States Patent and Trademark Office*

CERTIFICATE OF CORRECTION (continued)
U.S. Pat. No. 10,250,683 B2

*one or more output devices in a format which is compatible with a native format of the one or more output devices; and*

*operating the plurality of nodes of the server node arrangement to process data content there through in a manner allowing for dynamically-changeable image rescaling in response to user input at the one or more output devices."*

Should read:
--*A non-transitory computer-readable storage medium comprising a set of computer-readable instructions stored thereon, which, when executed by a processing system, cause the processing system to process data in a server node arrangement comprising having a plurality of nodes, the plurality of nodes of the server node arrangement being coupled via a communication network to a plurality of source devices of input data, and to one or more output devices, wherein the plurality of nodes of the server node arrangement are operable to receive data content from the plurality of source devices of input data, and to process the data content for supplying to the one or more output devices, by performing the steps of:*
*steps comprising:*

*hosting one or more processes at the plurality of nodes of the server node arrangement which are operable to:*

*determine a form which is compatible to a native data rendering format of the one or more output devices, wherein the form includes a native resolution of the one or more output devices, and*

*process data content into the determined form and into the native resolution of the one or more output devices;*

*rendering the data content from the plurality of source devices of input data at each of the one or more output devices simultaneously and without scaling the processed data content;*

*operating the plurality of nodes of the server node arrangement to supply the processed data content to the one or more output devices in a manner compatible with a region-of-interest (ROI) of the one or more output devices;*

*operating the one or more output devices to define in a message to the server node arrangement one or more parameters which define one or more native formats in which the one or more output devices require their data content to be supplied from the server node arrangement;*

*operating the plurality of nodes of the server node arrangement to store data content from the one or more source devices of input data in its original resolution, and supply the data content to the one or more output devices in a format which is compatible with a native format of the one or more output devices; and*

*operating the plurality of nodes of the server node arrangement to process data content there through in a manner allowing for dynamically-changeable image rescaling in response to user input at the one or more output devices.*--